US008707095B2

(12) United States Patent
Grimshaw

(10) Patent No.: US 8,707,095 B2
(45) Date of Patent: Apr. 22, 2014

(54) DATACENTER UTILIZING MODULAR INFRASTRUCTURE SYSTEMS AND REDUNDANCY PROTECTION FROM FAILURE

(75) Inventor: Josh Grimshaw, Jersey City, NJ (US)

(73) Assignee: Beacon Property Group LLC, Jersey City, NJ (US)

( * ) Notice: Subject to any disclaimer, the term of this patent is extended or adjusted under 35 U.S.C. 154(b) by 283 days.

(21) Appl. No.: 13/183,105

(22) Filed: Jul. 14, 2011

(65) Prior Publication Data
US 2013/0019124 A1 Jan. 17, 2013

(51) Int. Cl.
*G06F 11/00* (2006.01)

(52) U.S. Cl.
USPC ............................................. 714/14; 714/22

(58) Field of Classification Search
USPC ........... 714/14, 22, 24; 713/310, 340; 52/79.1
See application file for complete search history.

(56) References Cited

U.S. PATENT DOCUMENTS

| | | | |
|---|---|---|---|
| 6,176,046 B1 | 1/2001 | Quine et al. | |
| 6,320,271 B1 | 11/2001 | Hill et al. | |
| 6,859,366 B2 | 2/2005 | Fink | |
| 6,967,283 B2 * | 11/2005 | Rasmussen et al. | 174/50 |
| 7,278,273 B1 | 10/2007 | Whitted et al. | |
| 7,511,959 B2 | 3/2009 | Belady et al. | |
| 7,852,627 B2 | 12/2010 | Schmitt et al. | |
| RE43,177 E * | 2/2012 | Paik et al. | 307/115 |
| 8,181,406 B2 | 5/2012 | Tan et al. | |
| 8,264,840 B2 | 9/2012 | Bergthold et al. | |
| 2004/0244310 A1 | 12/2004 | Blumberg | |
| 2009/0229194 A1 | 9/2009 | Armillas | |
| 2010/0211810 A1 | 8/2010 | Zacho | |
| 2011/0025129 A1 * | 2/2011 | Humphrey et al. | 307/64 |
| 2011/0215645 A1 * | 9/2011 | Schomburg et al. | 307/65 |
| 2012/0000975 A1 * | 1/2012 | Heath et al. | 235/375 |
| 2012/0054527 A1 * | 3/2012 | Pfeifer et al. | 713/340 |
| 2012/0055012 A1 * | 3/2012 | Gauthier et al. | 29/592.1 |
| 2012/0300372 A1 * | 11/2012 | Bergthold et al. | 361/601 |
| 2013/0007515 A1 * | 1/2013 | Shaw et al. | 714/14 |
| 2013/0148291 A1 * | 6/2013 | Slessman | 361/679.46 |

OTHER PUBLICATIONS

Emerson Network Power, SmartMod: "Intelligent, Integrated Infrastructure for the Data Center", http//www.emersonnetpower.com/en-US/Solutions/ByApplication/DataCenterNetworking/SmartSolutions/Documents/SL-11480.pdf, © 2012, pp. 1-8.
ActivePower, "Continuous Power Solutions / Your Data Center, Your Way", http://www.activepower.com/ContinousPowerSolutions, retrieved from the Internet Dec. 5, 2012.
IO data centers, " IO.Anywhere", http://www.iodatacenters.com/modular-data-center/, © 2007-2012.
Datacenterdynamics Focus, Focus on Containers, A special technology insert to DatacenterDynamicsFocus, Copyright date 2011, "A Powerful Thought," pp. 13-14, from http://anax8em.pressmart.com/focusoncontainers/index.aspx?issue=01-jun-2011&page=09.

* cited by examiner

*Primary Examiner* — Marc Duncan
(74) *Attorney, Agent, or Firm* — Lerner, David, Littenberg, Krumholz & Mentlik, LLP

(57) ABSTRACT

A datacenter housing servers, computers, data storage devices, telecommunications and related equipment for storing and accessing large amounts of data on a continuous, uninterrupted and reliable basis, which is provided with a supporting system or infrastructure for supplying power and cooling to the datacenter, which involves equipment primarily contained in modules situated outside the building that houses the primary computer and server equipment, whereby said supporting system or infrastructure is designed with redundant equipment, connections, and controls to avoid any single point of potential failure.

18 Claims, 6 Drawing Sheets

DATACENTER UTILIZING MODULAR INFRASTRUCTURE SYSTEMS AND REDUNDANCY PROTECTION FROM FAILURE

BACKGROUND OF THE INVENTION

The present invention relates to a datacenter (also known as a data centre) which is a facility that houses servers, computers and associated components, such as telecommunications and other equipment that store and backup large amounts of data. Such datacenters must store the data safely and effectively, which requires that the center include adequate backup systems, equipment and procedures to assure continuous operation, including continuous access to data, protection of equipment, including adequate cooling, and security. The primary systems requiring backup are the electrical system and cooling system, which are the fundamental systems to enable the continuous operation of the servers, computers, communications and security systems.

Today, many datacenters are created in specially designed, stand-alone buildings, with few windows, and are well-sheltered from the outside weather conditions that can degrade or damage equipment. Also, the buildings are designed with special attention to exhausting heat generated by the continuously operating equipment.

Among the needs that have arisen with the recent proliferation of datacenters is a design for the infrastructure of supporting equipment and systems that enables datacenters to be housed in a cost-efficient manner within available, existing building structures. There are numerous advantages to creating a datacenter which utilizes an existing building. Economic times may make existing structures more readily available in desirable locations and at a cost that is substantially less than a building of new construction. Use of an existing structure can provide other financial opportunities such as the leasing of a building, which can reduce upfront costs in creating a new datacenter. The construction of a new building may face several hurdles including zoning limitations for newly constructed buildings and the difficulty in finding an undeveloped site for construction of a new building. A site that would be suitable with demolition of an existing building can force further issues in terms of the demolition itself and community and governmental limitations on the replacement structure. The construction of a new building optimally designed for the datacenter use may not conform with the local zoning requirements.

The design for the infrastructure of the datacenter should provide equipment that is available and accessible for repair, replacement and upgrading, without causing the datacenter to interrupt operations. Additionally, there is an ever-demanding requirement to provide a datacenter which can be expanded to accommodate more servers and computers, or to enable the replacement of existing servers and computers with updated or new generation models of greater speed or capacity.

New equipment of greater speed or capacity can generate greater amounts of heat requiring increased cooling and air circulation demands, as well as necessitating an increased power supply. Therefore, the increase in servers or computers or the use of new models of servers or computers can require additional demands on the supporting systems and equipment supplying power and cooling. This underscores the need for the datacenter to be planned with the ability to expand the power and cooling resources for supporting the datacenter.

From a cost standpoint and based on environmental and structural considerations, it is desirable to develop an infrastructure of supporting systems for a datacenter that can be located outside the building that houses the servers and computers. For example, existing buildings sought to be utilized for a new datacenter may not be adequate to accommodate the specialized, large and heavy equipment required to provide backup power and other supporting systems. Also, the expansion of an existing datacenter may be impossible unless supporting systems are removed from the building to provide additional space for the added computers and servers that are needed.

It has been recognized that power and cooling systems for a datacenter can be included in modular units, and that such an approach can provide savings and advantages. www.activepower.com/no_cache/solutions/whitepapers. For example Sun Microsystems introduced its Sun Modular Datacenter which included in a 20-foot shipping container the equipment needed to operate a 200-kW of IT capacity. The Sun modular datacenter is intended to rapidly install an entire datacenter, not only the infrastructure systems but all equipment, even the general purpose racks for servers, storage and other equipment. While the Sun Microsystems Modular Datacenter approach may be appropriate for installing a complete datacenter in unusable areas where a building is not available, such an approach does not achieve the approach of many IT organizations seeking to utilize an existing building in a desirable location.

In another modular system for datacenters from Liebert Corporation of Columbus, Ohio, a system known as SmartMod™ is described which includes modular units for an integrated infrastructure as well as housing for the datacenter itself.

U.S. Pub. No. 2010/0290197 describes equipment for a datacenter which is provided in a modular configuration. However, this publication contemplates a new building specially designed for the modular system which would include the cooling system in the building. The publication also describes the system as having a single point of failure (see, e.g. publication in FIG. 6, between the exterior bus cross-over 601 and the main switch board 609).

BRIEF SUMMARY OF THE INVENTION

The present invention relates to a datacenter and an infrastructure for systems and equipment supporting a datacenter. The infrastructure includes modules which can be installed outside of the building which houses the fundamental servers and related computer equipment of the datacenter. Among the key features of this infrastructure is that the power, cooling and switching components of the infrastructure are configured to avoid any single point of potential failure in its operation. This is important to assure reliable and continuous operation of the datacenter. Therefore there is a redundant path for the operation of the systems.

The datacenter of the invention is capable of providing continuous and secure access and storage for data, said datacenter comprising:

a facility for housing computers, servers and associated computer and telecommunications equipment; and an infrastructure support system for providing electrical power and cooling for said facility, said infrastructure support system primarily situated outside said facility, said electrical power infrastructure comprising equipment and containers or modules containing equipment, said electrical power infrastructure comprising:

a) a primary switchboard module containing a switchboard or switchgear and a plurality of automatic transfer switches (ATS);

b) a secondary or reserve switchboard module containing a switchboard or switchgear;
c) two or more generators for generating electrical power;
d) two or more transformers; and
e) two or more uninterruptible power supply (UPS) units or systems, each including energy storage devices (ESD).

According to the electrical power infrastructure, utility-sourced electrical power flows to a primary transformer and then to a primary switchboard module containing a main or primary switchboard, from which electrical power flows to a plurality of automatic transfer switches (ATS) in a switchboard module which subsequently transfers electrical power to one or more UPS systems within one or more UPS modules, said UPS systems distributing electrical power to the facility and other systems of the datacenter.

If there is a loss in utility-sourced electrical power, one or more ATS units within a switchboard container is capable of detecting the loss of utility power and sensing alternative available power sources in the infrastructure and is capable of carrying out steps to transfer the load to one or more available alternative sources of electrical power. Also, if there is a loss in utility-sourced electrical power, said primary switchboard is capable of receiving electrical power from a primary generator source in the infrastructure.

The secondary or reserve switchboard in a secondary or reserve switchboard module, is capable of being activated by an ATS in a switchboard module, said secondary switchboard capable of receiving utility-sourced electrical power from a secondary or reserve transformer that bypasses the primary transformer and primary switchboard, said secondary switchboard also capable of receiving electrical power from a reserve generator source which bypasses the primary switchboard and is capable of transferring electrical power to one or more automatic transfer switch units.

The ATS units in said primary switchboard module are capable of transferring electrical power along alternative pathways to one or more uninterruptible power systems (UPS).

The electrical power infrastructure contains redundancies in equipment, pathways and connections to avoid any single point of potential failure in the availability of electrical power for operating the facility. The capacity of the infrastructure electrical power system based on utility-sourced electrical power exceeds the load of the facility and the cooling system for the facility and the capacity of the infrastructure electrical power system based on non-utility sourced electrical power exceeds the critical load for the operation of computer-related and telecommunications-related equipment in the facility.

The generator and transformer equipment are not necessarily contained within a module. A UPS module can contain one, two or more UPS units or systems. Each UPS system includes energy storage devices, such as batteries. The energy storage devices of a specific UPS system can be located in the same or a different module than that containing the UPS system.

The electrical power infrastructure which contains components which are capable of (a) detecting an interruption in the flow of utility-sourced power, (b) shutting off the electrical pathway to the utility-sourced power when said interruption is detected, (c) triggering the operation of UPS and energy storage devices when said interruption in utility-sourced power is detected, (d) triggering the operation of generator equipment after said interruption in utility-sourced power is detected, (e) detecting the capability of generator equipment to supply electrical power to infrastructure components and opening the pathway for the flow of electrical power from said generator equipment to said infrastructure components, upon such detection shutting off the flow of electricity from said energy storage devices, and (f) detecting the resumption of the utility-sourced electrical power and when said resumption is detected, shutting off the electrical pathway to the generator sourced power when said resumption is detected, triggering flow of electricity from said UPS and energy storage devices, opening the pathway for flow of utility-sourced electrical power system to infrastructure components, terminating the operation of said generator equipment.

The invention also provides for an infrastructure support system for a datacenter, said infrastructure system having redundant components, connections, pathways and controls to be capable of supplying substantially uninterrupted power to operate computer and related equipment within the datacenter, said infrastructure components substantially situated outside a building that substantially contains the computer and related equipment, said infrastructure power system comprising control equipment that senses or controls or activates equipment to supply usable electrical power to computer and related equipment of the datacenter even when there is a failure in the flow of utility-sourced power, said equipment capable of a) detecting an interruption in the flow of utility-sourced power,
b) shutting off the electrical line to the utility sourced power when said interruption is detected,
c) triggering the operation of the energy storage devices when said interruption is detected,
d) triggering the operation of generator equipment when said interruption is detected,
e) detecting the capability of generator equipment to supply usable electrical power to said datacenter components and upon such detection shutting off said energy storage devices, and
f) detecting the resumption of the utility-sourced electrical power and when said resumption is detected, terminating the operation of said generator equipment or said energy storage devices;

The modular containers are substantially fabricated at a site distant from the datacenter and each modular container is capable of being accessed for servicing or entirely removed from the datacenter without interrupting the operation of the other components of the datacenter. The modular containers each have exterior connections for accessing components therein and for connecting components therein with other modules in the infrastructure.

A datacenter that comprises the electrical power infrastructure of the invention has a benefit of versatility and flexibility in connection with the location for equipment for supporting the datacenter. In accordance with the invention, said electrical power infrastructure is primarily located outside the facility or building that houses the server and related equipment, allowing the space within the facility or building to be utilized for equipment other than that embraced by the electrical power infrastructure. Also, the infrastructure provides flexibility for expansion of the capacity of support systems and for accessibility to system equipment for repair, upgrades and replacement. More specifically, the invention provides a modular, pod design for the power and cooling systems and their control systems, which includes multiple back up equipment, operations, procedures and methods to assure continuous service and which features "redundancy optimization" and "cost optimization."

The present invention also relates to a method for operating a datacenter with the above described infrastructure. The datacenter infrastructure of the invention comprises redundant systems for supplying power and cooling to a datacenter to assure the reliable and substantially uninterrupted operation of computers, servers and other equipment present in the datacenter. The infrastructure is characterized by components that can be utilized inside an existing building and/or exterior to and in proximity to the building housing computer servers and related equipment.

The power system is capable of supplying substantially uninterrupted electrical power to the datacenter and providing said power from a utility power source or from components within the power system. The components of the power system are substantially contained within one or more modular containers, and the power system components comprise (i) controlling systems for determining the utilization of utility sourced power, battery power and power from generators; (ii) a transformer system; (iii) a battery system; and (iv) a generator system.

The transformer system of the power system comprises one or more transformer units, which operate when there is electricity flowing from the utility source of electrical power to the transformer system, and which is capable of converting the utility sourced electrical power to a level of voltage suitable for use by the components of the datacenter wherein said transformer system having a redundancy capability and design permitting each of the transformer units to operate independently of one another in the event one of the plurality of transformer units malfunctions or becomes inoperable.

An energy storage device (ESD) is included within each UPS system or unit of the power system and it comprises a ready and available power source. An ESD of one UPS system is capable of supplying electrical power independently of an ESD of another UPS system. The UPS system controls all operations of its ESD, including charging, recharging, discharging, monitoring, activating and shut off. The UPS systems of the datacenter's power infrastructure are capable of supplying electricity from one or more ESD sources with a capacity that exceeds the amount required to operate the computer and related equipment of the datacenter during the necessary operating time period, wherein the UPS systems provide a redundancy capability and design for providing sufficient power in the event an ESD of a UPS system malfunctions or is inoperable.

ESD are activated when the utility sourced power is interrupted, and shut off when either the utility sourced power is activated or the generator system is capable of supplying sufficient electrical power to operate said datacenter and other components of the datacenter.

The generator system of the power system comprises a plurality of components each capable of operating independently of one another and each capable of supplying sufficient electrical power to operate the datacenter, activated when the utility sourced power is interrupted and shut off when the utility sourced power resumes, the generator system being capable of supplying sufficient electrical power to operate said datacenter and components of the datacenter with a capacity that exceeds the amount required to operate the datacenter including supporting systems of the datacenter during the time period of required operation of the generator system, wherein said generator system having a redundancy capability and design permitting each of the generator components to operate independently of one another in the event one of the plurality of generator components malfunctions or becomes inoperable.

The infrastructure cooling system for the datacenter is capable of providing reliable cooling to the datacenter, wherein the cooling system comprises a plurality of compressors each capable of operating independently of one another and a plurality of air handlers each capable of operating independently of one another and having a cooling capacity that exceeds the cooling capacity required for operating the datacenter. The cooling system is preferably physically located above or adjacent one or more of the modular containers containing the power system.

In general, each of the power, cooling and controlling systems for the datacenter has a redundancy capability and design permitting its individual components or groups of its components to operate independently of other similar individual or groups of components in the event an individual or group of components malfunctions or becomes inoperable.

The datacenter includes a building containing an area that features a plurality of rows of servers and other computing equipment. In a preferred embodiment the building housing the rows of servers and other equipment does not house the modules or containers that contain the electrical power infrastructure. The datacenter may also include a general multi-purpose area which may optionally include a control room, an operations center, a reception area, a conference center, offices and other areas for use of staff, visitors and customers. Also included within the datacenter may be an area for network connections for the computing equipment, and a mechanical area for facilitating the supporting systems of the datacenter. The control room or operations center can be a site for staff to monitor and control computers, servers and other equipment and their resources and to coordinate the receiving, distributing and transmitting of data within and outside the datacenter.

BRIEF DESCRIPTION OF THE DRAWINGS

The drawings identified below provide a further understanding of the invention and/or illustrate embodiments of the invention.

The following discussion and drawings are provided to describe illustrative features of the present datacenter infrastructure, and are therefore not intended to limit the scope of the datacenter infrastructure described herein. In the following discussion and appended drawings, the present datacenter infrastructure is described only by way of illustration. Therefore, the number of components, modules, devices, equipment, and capacity thereof described with regard to these illustrative embodiments is not intended to limit the scope of the invention, but rather to illustrate various features of illustrative embodiments thereof.

Incoming utility power also flows from the utility source to a second transformer component TX2, then to a reserve switchboard disposed in a reserve or secondary switchboard container or module. This provides an alternative and redundant source of power for the data center in the event of failures or a need to service the primary switchboard or the primary generator source. The second transformer component TX2 could be alternatively connected to the primary switchboard. The reserve switchboard is also connected to reserve genset power, a generator source different from the primary generator source.

The generators and transformers may be included in one or more containers, or may be designed to operate outside containers in the area reserved for the infrastructure modules.

The first transformer component TX1 and second transformer component TX2 may each comprise a plurality of transformer units and said transformer units can be reassigned during operation to function as the primary or secondary transformer. In general, one should not comingle transformers if operating in groups.

The first generator source and second or reserve generator source may each comprise a plurality of generator units and said generator units can be reassigned or reconnected during operation to function as part of the first generator source or the second generator source.

Electrical power flows via a set of electrical paths from the main switchboard to a plurality of automatic transfer switches (ATS). The reserve switchboard is also electrically connected via a plurality of electrical paths to said ATS units. Therefore, when the reserve switchboard is operational, electrical power can flow from the reserve switchboard to the ATS units.

Figure 1:
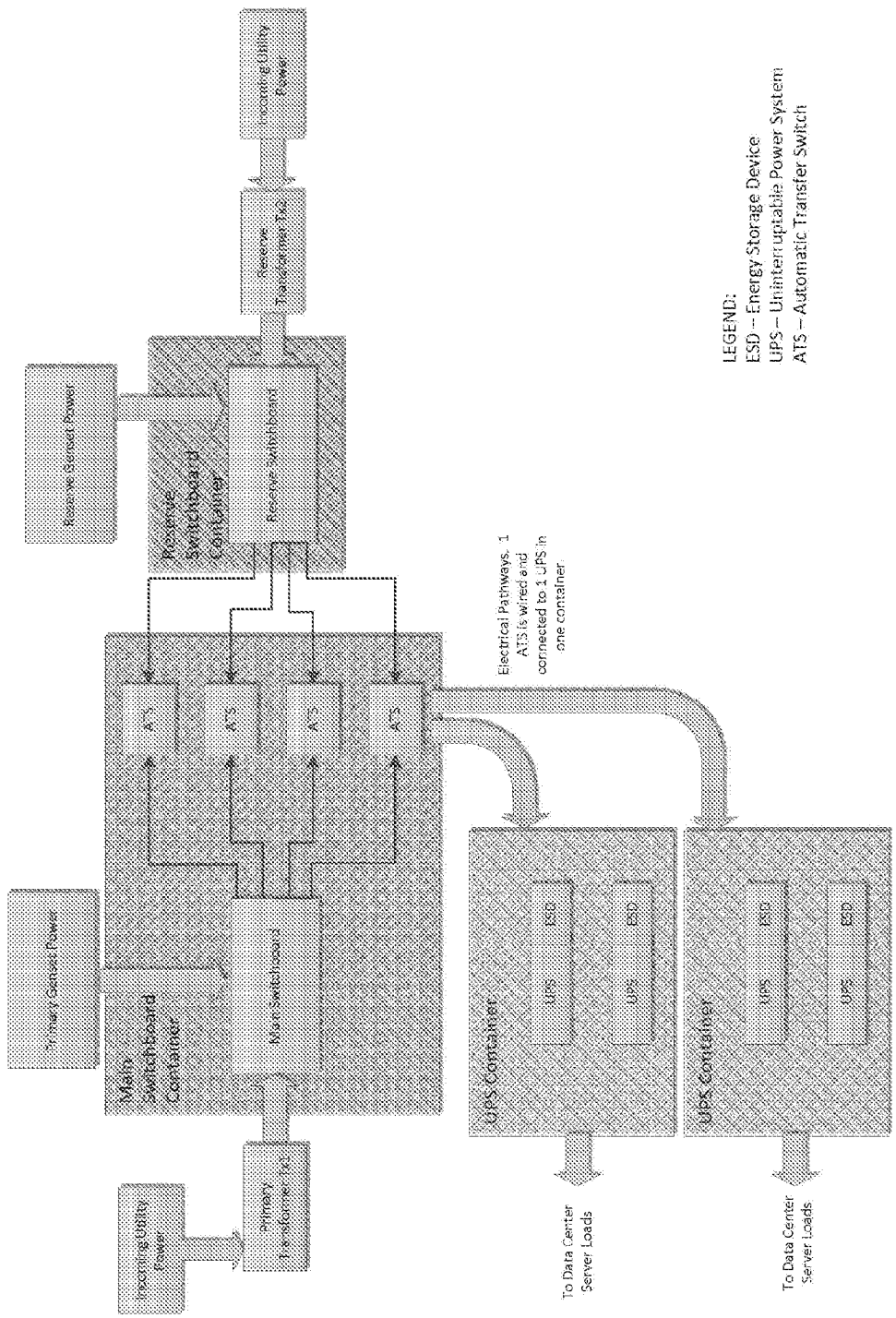
FIG. 1 is a System Flowchart schematically illustrating the flow of electrical power through components of an embodiment of the datacenter infrastructure of the invention. Incoming power flows from a utility power source to a first transformer component TX1, then to a main switchboard, located in a main switchboard container or module. The main switchboard is also connected to primary genset power, a primary generator source, which provides electrical power in the event of an interruption to the flow of electrical power from the utility source.

In the exemplary embodiment shown in FIG. 1, the infrastructure includes two uninterruptible power supply (UPS) modules or containers, each containing one or more uninterruptible power supply systems. Energy storage devices (ESD) (e.g., batteries) are a subsystem or component of a UPS system. A UPS system preferably provides continuous power to the downstream load in the event of a loss of utility power by sensing the loss of utility power and then modifying electrical paths to supply power from the standby energy storage devices in a UPS container. Each ATS is electrically connected to one UPS system, such that the electrical power flows from each ATS to one UPS system, housed in a UPS container. From each UPS container, electrical power flows through electrical pathways to the datacenter including its server, related computer loads, and other electrical loads (control systems for cooling system, monitoring devices, etc.)

FIG. 1 illustrates that the electrical power system in this embodiment of the infrastructure has no single point of potential failure because of the presence of redundant equipment, functions and connections. For example, each of the ATS and UPS units can be uninterruptedly taken off line while electrical current flows through the remaining online ATS and UPS units.

Figure 2A:
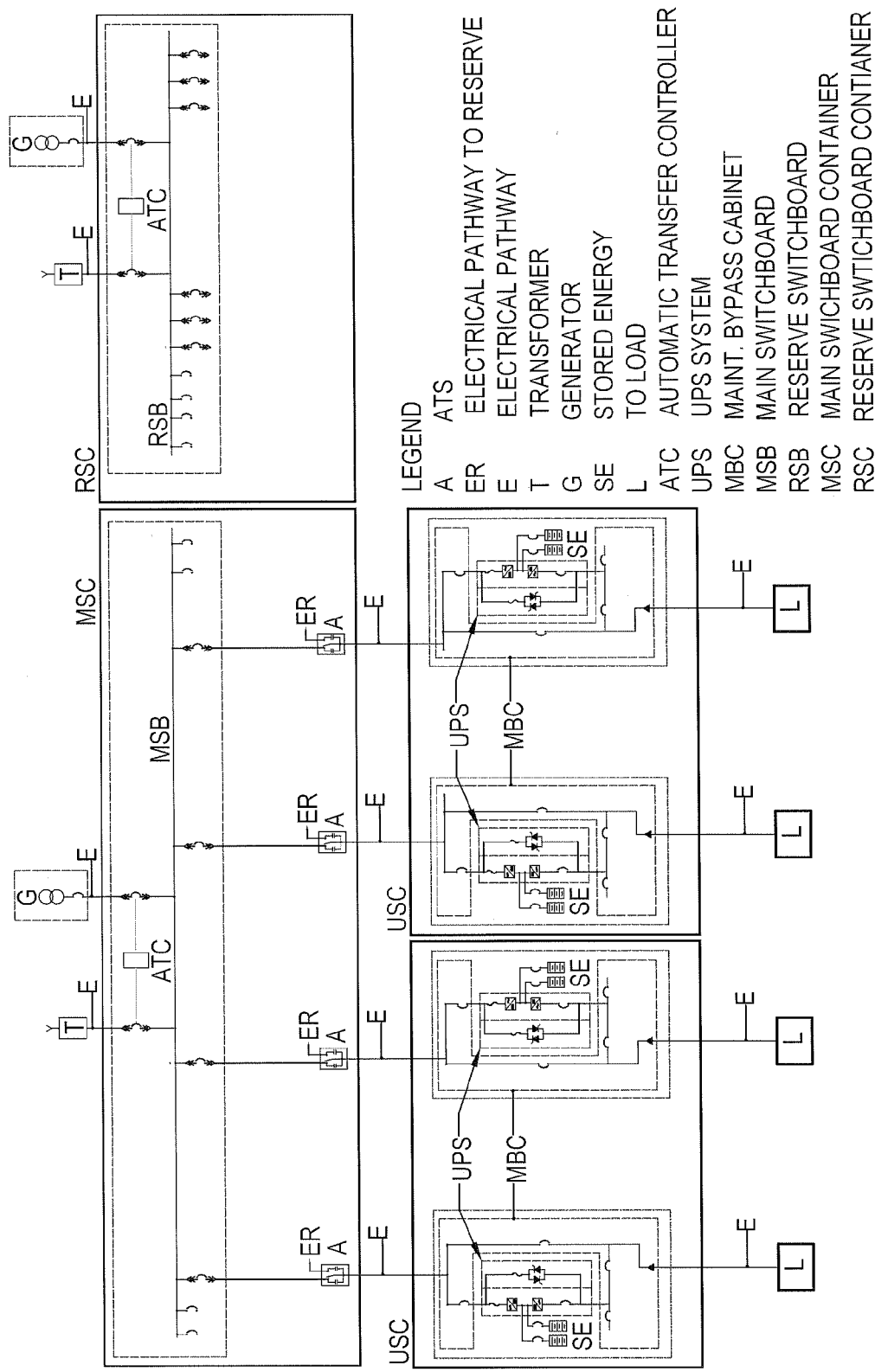
Figure 2B:
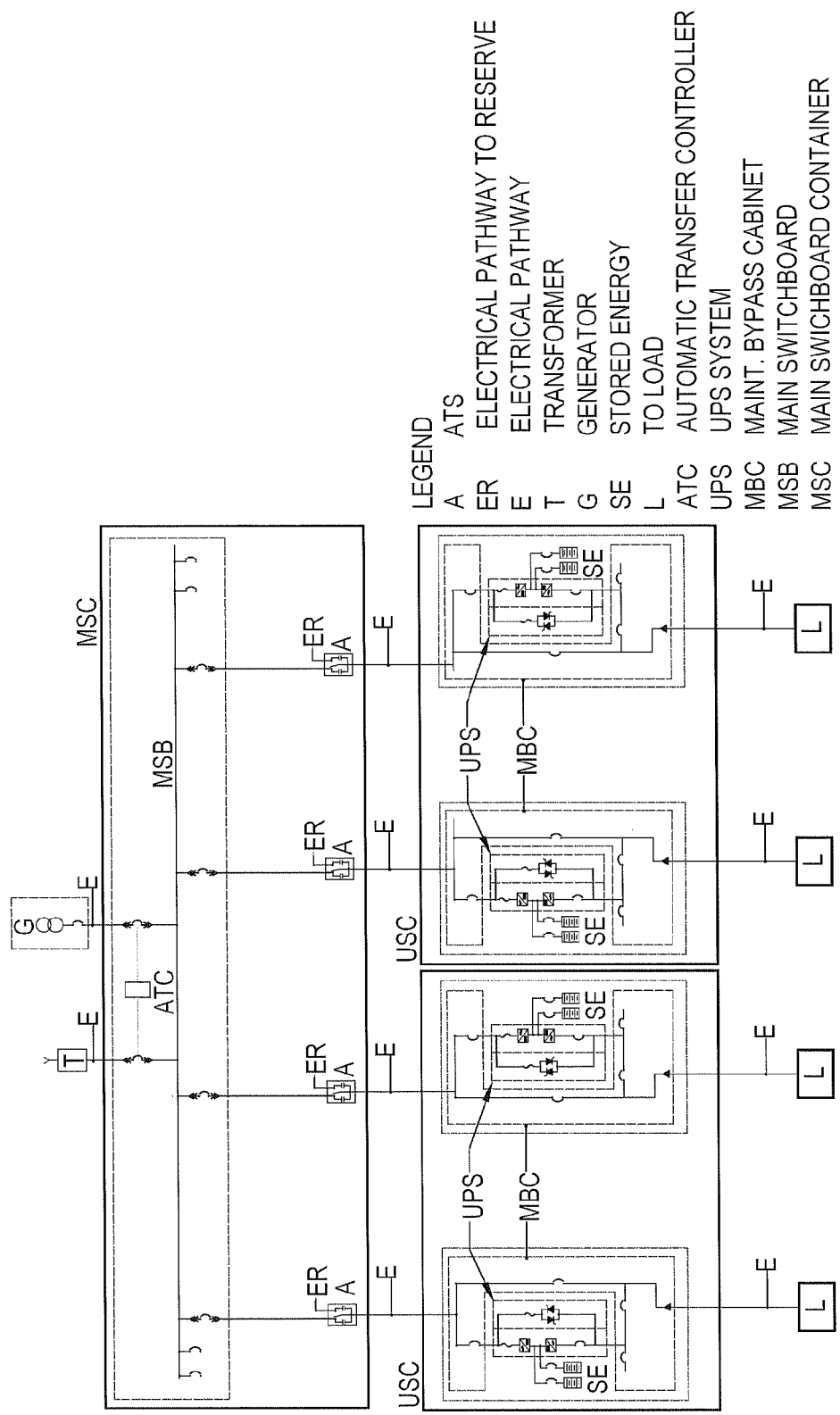
Figure 2C:
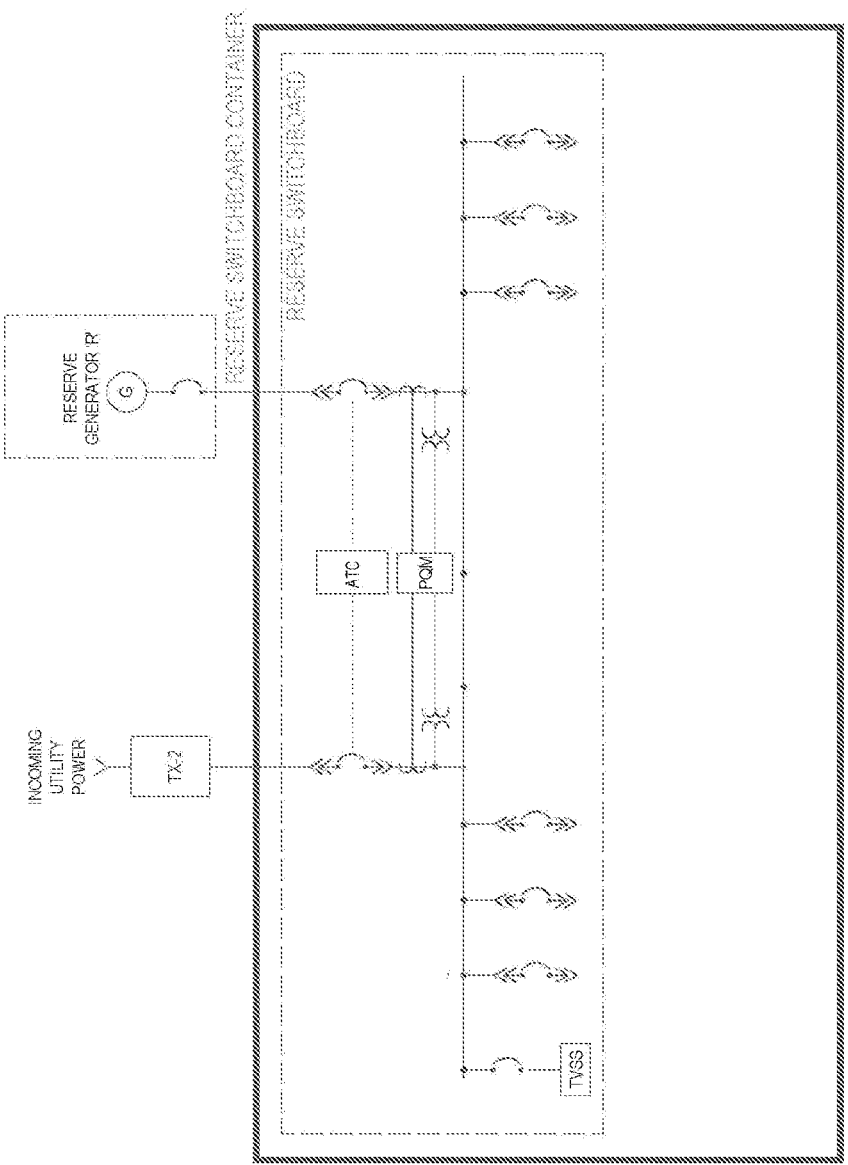

FIG. 2A is a circuit diagram illustrating the electrical connections between the components of the electrical system infrastructure in one embodiment of the datacenter infrastructure invention. FIGS. 2B-2C provide greater details for components shown in FIG. 2A, e.g., showing the connections between such components and other components of the electrical infrastructure.

FIG. 2A generally shows a primary switchboard container, containing a primary switchboard unit and ATS units. Other embodiments may include one or more additional primary switchboard containers. Shown adjacent the primary switchboard container is a reserve switchboard container, which contains a reserve switchboard unit that is connected to ATS units located in one or more of the primary switchboard containers. Each of the shown primary switchboard and reserve switchboard is connected via an ATS to a UPS system in a UPS container. Four UPS systems in two UPS containers are shown in the figure, each container shown containing two UPS systems. In other embodiments, a UPS container may include, for example, one UPS system. Also shown in the figure are blocks depicting the loads in a datacenter that are connected to each of the UPS systems in the UPS containers.

FIG. 2B shows in greater detail the primary switchboard container of FIG. 2A that is electrically connected to a transformer and to a primary genset. An automatic transfer controller (ATC) is present in the electrical pathways from the generator and from the transformer to the switchboard. When the ATC senses an interruption in the electrical power flowing from the transformer it terminates that connection. The ATC then initiates the generator and opens the electrical connection to the generator (closing the main circuit breaker connected to the generator), such that the generator, rather than the utility source of electrical power, becomes the source of electricity flowing to the primary switchboard. When the ATC senses a resumption in the electricity supply from the utility source, the ATC terminates the connections to the generators (opening the main circuit breaker to the generators) and opens the electrical connection to the transformer (closing the main circuit breaker to the transformer) such that the utility source of power then supplies electrical power to the primary switchboard.

The primary switchboard container includes a primary switchboard unit connected to a plurality of ATS units. The reserve switchboard is also connected to ATS units in the primary switchboard container, as indicated by the notation "ER" (representing "electrical pathway to reserve") adjacent the ATS units in the figure. The reserve switchboard is shown in greater detail in FIG. 2C.

In the event that a primary switchboard in a primary switchboard container experiences a failure or a maintenance concern, one or more ATS units switch the incoming electrical power to flow to the reserve switchboard. As shown, the ATS units are additionally connected to the UPS systems. Therefore, electrical power flowing to the ATS units from either a primary switchboard or a reserve switchboard is relayed to a UPS system.

According to FIG. 2B there are four UPS systems housed in two UPS containers. Other embodiments may include a different number of UPS systems, for example, three UPS systems housed in two UPS containers. Each UPS system is electrically connected to the datacenter building, such that electrical power flows from the UPS system to the servers, related computers, and other electrical loads within the datacenter building.

FIG. 2C shows in greater detail the reserve switchboard container. In the embodiment shown, the reserve switchboard container includes connections to a reserve generator (reserve genset). As shown, the reserve switchboard is electrically connected to a transformer that is different from the transformers connected to the primary switchboards. In another embodiment, a reserve switchboard can be connected to and utilize one or more transformer units that are also connected to a primary switchboard.

As shown in FIG. 2C, the reserve switchboard container includes its own ATC. The reserve switchboard is electrically connected to the ATS units of one or more primary switchboard containers which ATS units are connected to one or more UPS systems.

Figure 3A:
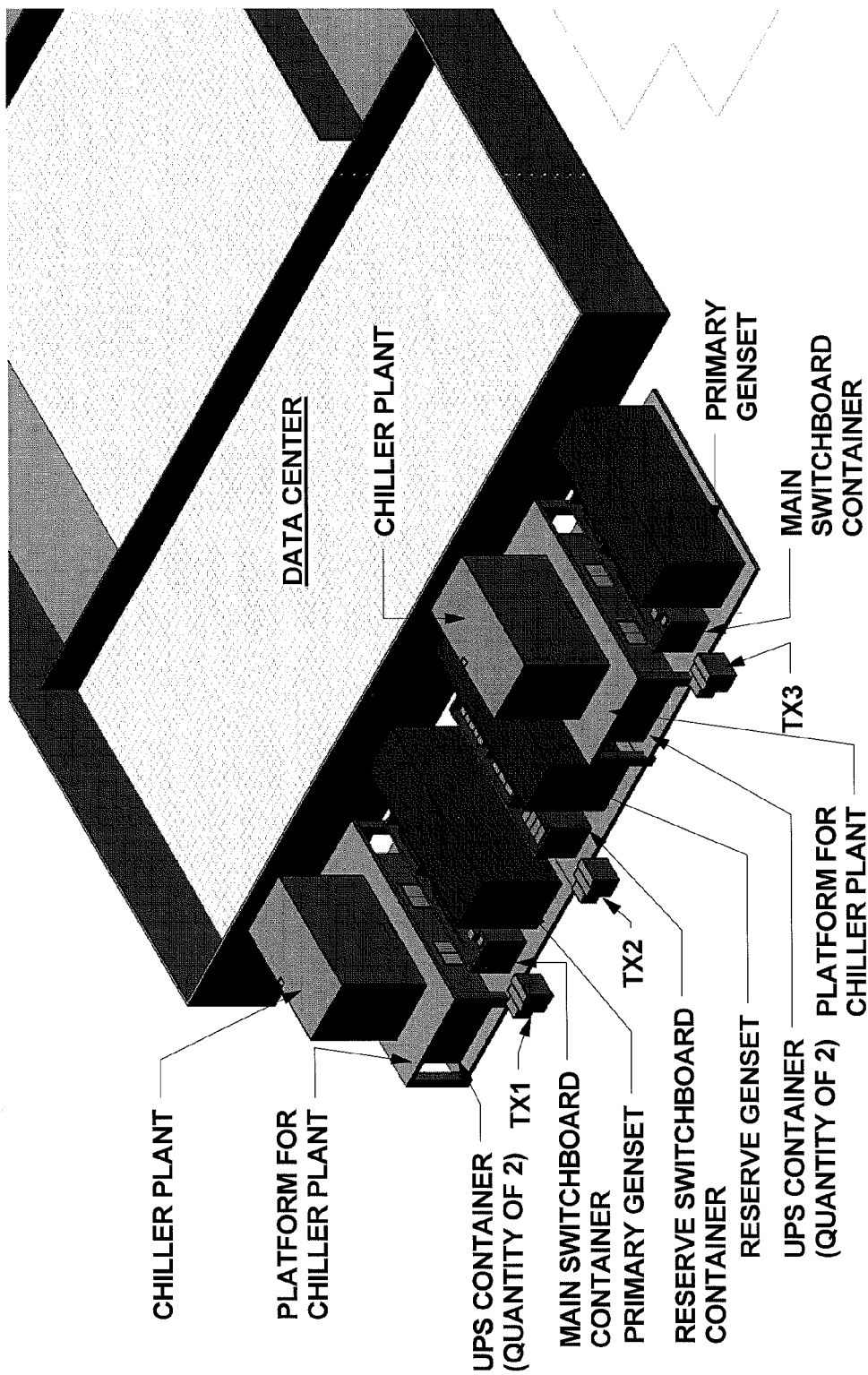

FIG. 3A illustrates a perspective, overhead view of a site plan for a datacenter infrastructure embodiment of the invention. FIG. 3A illustrates an embodiment including three generator containers (two primary genset and one reserve genset), two primary switchboard containers, one reserve switchboard container, four UPS containers (each containing two UPS systems) and three transformer units. Also shown is a cutaway view of part of the server room within a datacenter building. FIG. 3A also illustrates two chiller plants each arranged over one of the UPS containers on a support structure.

Figure 3B:
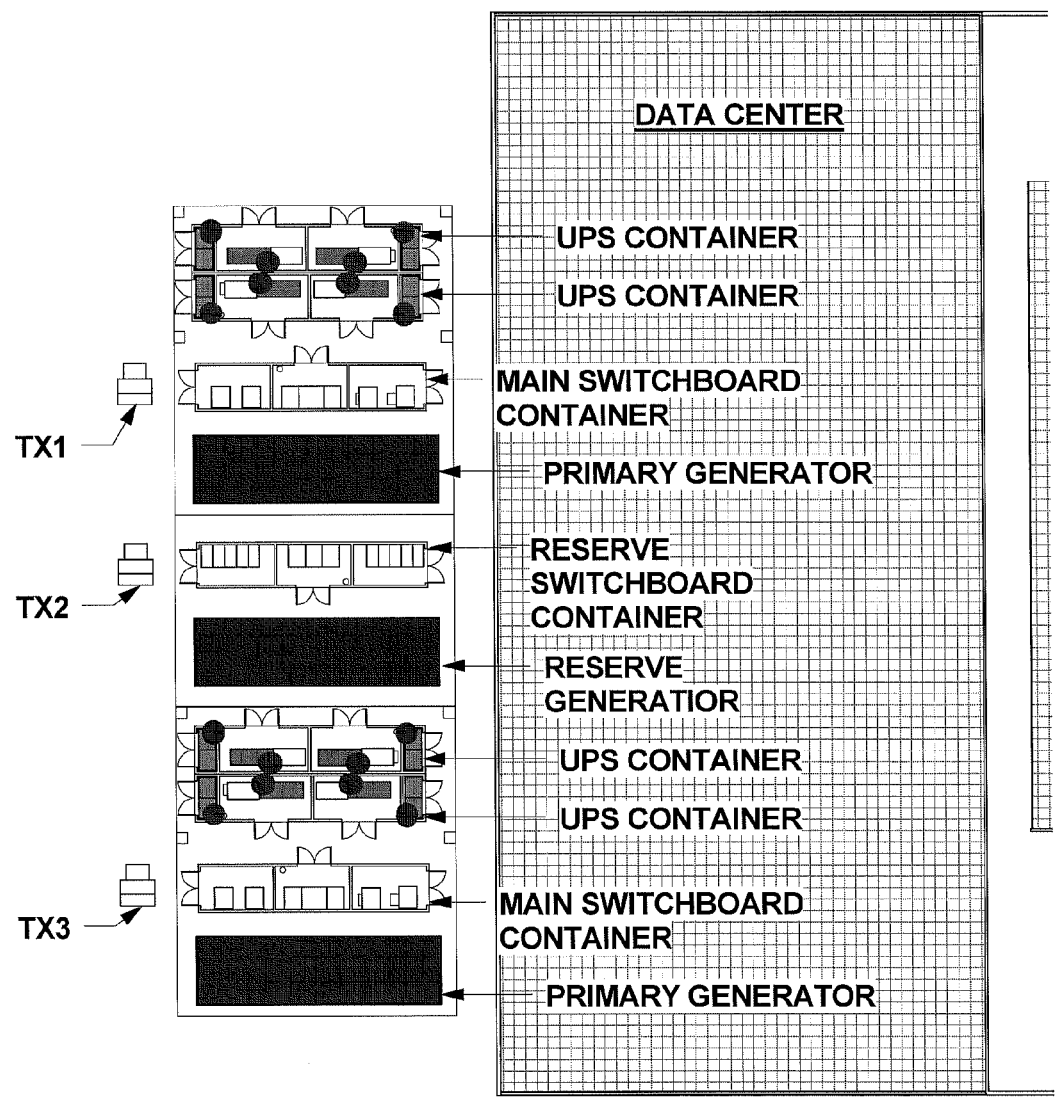

FIG. 3B illustrates a plan view of the datacenter power system infrastructure embodiment shown in FIG. 3A.

DETAILED DESCRIPTION

The datacenters of the present invention include facilities that are used to house computer systems and associated components, such as telecommunications and storage systems. Datacenters contain telecommunication systems to allow users to communicate, manipulate, and store data in controlled and secured locations. Datacenters are designed to deliver the necessary energy and cooling required to power each piece of computer equipment. Each device in a data center creates heat, and one of the primary objectives of a data center is to provide an environment that allows for the safe operation of each computer component and related equipment. Most computer equipment is equipped with methods to remove internal heat to the exterior of the unit. Datacenters use different methods to remove the heat from the datacenter building interior environment. By removing this heat, datacenters are capable of providing a safe, controlled environment for the equipment.

Datacenters of the present invention provide reliable power and a safe, reliable environment by using redundant systems to protect against a failure. The infrastructure systems of this invention include redundant, reserve or backup power supplies, data communications, connections, environmental controls (e.g., air conditioning, fire suppression etc.) and security devices.

The datacenters contemplated herein are categorized as Tia-942 Tier III. Such a datacenter has a demand for power to operate its cooling systems and other equipment that approaches loads from 500 kw-1000 kw and should be capable of being expanded from 1 MW to 5 MW, using the basic building blocks of the described modular or pod infrastructure system. As shown below, to support such a basic Tia-942Tier III datacenter, the power system infrastructure should include at least: two generator units, two UPS containers, one primary switchboard container, one reserve switchboard container and 2 transformer units. Such a datacenter preferably includes a cooling system infrastructure of at least: two chiller units and two air handlers.

The present invention is directed to a datacenter in which all or a substantial portion of its infrastructure or support systems and components are in a modular or POD-type structure, which can be installed outside of the primary facility housing computers, servers and related equipment. The modules containing the support systems are capable of transport from one location to another, such as from the site of manufacture or assembly to the site of the datacenter for installation and use. The design of the modules is such that modular units can be connected to and/or combined with one another to create a modular system for providing the various infrastructure systems for a datacenter. Such modules or pod units typically have a maximum dimension that conforms with intermodal transport requirements (within maximum volumes for trains, ships and roads). Presently, commonly stated maximum dimensions for a shipment are: 53 feet in length, by 8 feet in width, and by 9.5 feet in height. Common container lengths are 20 feet, 28 feet, 40 feet, and 48 feet and a typical height is 8.5 feet. Intermodal transportation is not necessarily a limitation in use because multiple modules can be assembled together at the site of use or equipment can be moved and delivered by means other than intermodal transportation. Different dimensions may be appropriate for the various different modules used in the infrastructure system.

The modular design here refers to the approach of subdividing a system into smaller parts (individual modules or containers) that can be independently created and then used as discrete scalable modules. Each module can be an isolated, self-contained functional element which provides the function of a system alone or in combination with other modules.

Advantages of the modular approach begin with a reduction in some costs, due to several factors including the ability to assemble the components and manufacture the modules off-site, following a more standard design, and readily transporting the modules to the datacenter location for efficient installation, requiring less of a need for customization. Since an entire system of the infrastructure is comprised of multiple modules, it presents a more flexible design, enabling easy access for repair, increase in capacity or function by merely adding a new module or updating of technology and other changes by replacing of modules. In the present modular system, performance has been optimized in the manner in which the modules are organized and controlled.

Modules do not need to be identical, but usually possess some features that are similar and coordinated, to provide attachment or connection, and functional integration into the support system. There are different amounts of similarity and variation among the modules, depending upon their respective function and role in the system. In general, the design of the overall modular system incorporates a balance of standardization and flexibility.

Some containers in the infrastructure system may require cooling to provide a thermally controlled environment within the container and should be suitably equipped to provide such cooling in a redundancy configuration and operation.

The infrastructure can include components that are not included within a module or container. Some components not within a module should be protected from the outdoor environment. It is preferred that they be sized and configured to conform or be compatible with modules or containers included in the infrastructure, for creating an aesthetic and functional outdoor site adjacent the datacenter building. For example, it is preferred that the size and shape of chiller units be chosen so they can be installed on a steel platform located above a UPS module. Generators and transformers may be utilized without a container but should be appropriately protected from the outdoor environment and be installed in a manner suitable for the overall outdoor site plan for the infrastructure components. For example, generators and transformers can be situated on the ground, on a concrete slab, or elevated and secured above one or more of the modules.

The equipment and other materials included within an infrastructure module can be pre-fabricated and assembled at one or more off-site locations and then transported to the site of the datacenter for final integration with other infrastructure modules for ultimate connection to the datacenter. Since the infrastructure modules are transportable, the system can be utilized as a portable infrastructure system that can be readily removed and moved from one site to another.

According to the invention, the infrastructure power system for the operation of a datacenter comprises the following components, installed and located outside a datacenter building:

1) Primary or Main Switchboard Module, including at least one ATS component
2) Secondary or Reserve Switchboard Module
3) Generators
4) Transformers
5) UPS Modules, including a UPS component and energy storage devices.

Preferably, the infrastructure power system is designed to support a datacenter critical load of at least about 400 kw-1000 kw. The terminology datacenter critical load is used herein to define the power required to provide continuous operation without interruption of computers and related devices. Therefore, the critical load includes, for example, the power required to continuously operate computers, storage devices, network equipment, controls and security. It normally does not include the cooling system, since an interruption of cooling will not immediately affect the operation of the datacenter. Therefore, the total power requirement for a datacenter is nominally larger than the critical load for the operation of the datacenter's computer-related equipment.

The critical load for most datacenters ranges from 1,000 kW to 10,000 kW of power. Higher load datacenters exist, but are less common. Even the higher load datacenters can be accommodated by the infrastructure of the present invention.

Among the factors that impact the total load for supporting a datacenter are the nature, efficiency and quantity of equipment, the footprint of the facilities and the environmental conditions. The modular system permits flexibility by adjusting the power output by adding or subtracting the power system modules. Also, the power system modules provide electrical power on a redundancy basis, e.g. a redundancy configuration of N+1 or 2N.

The power system infrastructure of the invention, during normal operation, conducts the flow of electricity from the utility source through components allowing the electricity to be safely utilized and protected. The normal source of power for a datacenter is electrical power from a utility source. The utility sourced power enters the primary switchboard module or container, which includes the primary switchboard or switchgear. In this application, the term "switchboard" is intended to embrace certain well-known switchboard and switchgear equipment. In the datacenter infrastructure the switchboard generally provides several functions. For example, the switchboard provides power availability control through source transfer systems, a distribution of power to multiple loads, opens and closes electrical pathways, and provides electrical protection of said pathways from dangerous circumstances such as overloading.

Also contained within the primary switchboard container or module are a plurality of automatic transfer switch (ATS) units. The ATS is an electro-mechanical device which can be fed power from the normal, primary utility source or from another energy source. The ATS distributes electrical power to uninterruptible power supply systems (UPS systems). Optionally, the ATS may also serve other functions of the facility infrastructure, including lighting, appliances, fire, safety and security, and control systems, etc.

If the primary utility source of power is unavailable, the primary switchboard module will sense this loss of utility power. Loss of power is defined as not only a complete termination in the supply of power but also as power supply fluctuations that are outside of appropriate tolerances, e.g., frequency or voltage.

In the event of a primary switchboard loss of power, the ATS senses the disruption or loss of power supply. Simultaneously, the ATS also senses alternative available power sources in the infrastructure (e.g., utility and/or generator power from the reserve switchboard), recognizes such sources as available, and can cause a transfer of the load to those sources. The ATS also has a function in activating the reserve or secondary switchboard and/or reserve generators. When the primary switchboard source of power is lost and if the ATS does not sense an alternative source of power from the reserve switchboard, then the ATS sends a control signal to the reserve switchboard or reserve generator, to activate the reserve system and supply power to the ATS.

The secondary switchboard in the secondary switchboard container or module functions as a separate, independent switchboard to act in reserve, in the event that the primary switchboard module, or any of its equipment becomes disabled or inoperable or must be taken offline for servicing or replacement.

The reserve switchboard module works with reserve power components, e.g., the reserve power generator source and reserve transformer power (from utility source), and has controls that recognize a failure between reserve power sources and implement transfer operations. This module also provides protective pathways for providing power to the ATS units in the primary switchboard modules. Like the primary switchboard, the reserve switchboard can also provide distribution of power for other services such as lighting, appliances, security, etc.

According to the module system of the invention, the generator and utility transformer modules are usually installed in an outdoor location. The transformers, necessary for converting voltage of utility-sourced power, may be in modules that are installed outdoors on concrete pads. The transformers are electrically connected to primary and/or reserve (secondary redundant) switchboard modules to provide power. The size of the generator system is tailored to support the demands of the datacenter including the infrastructure cooling system. The minimum size or capacity of the generators and transformers may be determined by starting with the datacenter critical load and the load demands of the cooling system. Preferably, diesel engine generators in outdoor enclosures can be used in the infrastructure of the invention.

The primary switchboard module contains the ATS units which provide the electrical pathway to the UPS module and its UPS system. The ATS units within the primary switchboard module provide redundant electrical paths to the UPS systems to assure redundant power sources. The primary switchboard modules also provide power for the cooling system and other services, such as lighting, appliances, security, etc.

In the operation of the power system the UPS module or container functions to assure power quality and fast acting control of the power supply. It is involved in the first response to a disruption in the utility power source and immediately transfers power from the energy storage devices, e.g. batteries, which are located in a UPS module. UPS units are commercially available components. Illustrative of UPS units that can be used herein are those available from Eaton, which provides several types of UPS devices e.g.,: (1) a double-conversion UPS, such as the Eaton 9355 model or Eaton MX models; and (2) a double-conversion on demand UPS, such as the Eaton Blade UPS model. (http://switchon.eaton.com/Education/Power-101/index.html).

Each UPS module has one or more UPS systems and contains controls and sensors for detecting a loss of utility power and for then delivering emergency power from energy storage devices, e.g. batteries, flywheels, etc. Generators can take from 9 to 12 seconds to go online and be able to provide full power. In this interim period, the UPS system will immediately sense the lack of power and initiate the operation of the stored energy devices. Once the primary generator(s) are ready to supply power, the load is transferred to the primary generators as an emergency source of power.

The UPS modules also are integrated to communications equipment to report failures and alarms. The UPS modules provide connection points to deliver power through pathways into the datacenter. It has its own coding equipment for providing power to the cooling system in a redundant fashion. These UPS modules provide convenience lighting and power for the interim or maintenance period when normal utility power is interrupted. The UPS modules containing this equipment can be paired off and linked with one or more containers to provide different redundancy topologies and configurations.

Several UPS topologies are usable in the present infrastructure power system. When a double conversion UPS system is used, it can eliminate voltage and frequency fluctuations by modifying incoming power, by first converting the AC to DC current and then back to AC. The UPS units also include a bank of energy storage devices, such as batteries or flywheel devices, which are more than sufficient to support the datacenter critical load for a period of several minutes or more.

The power leaving the UPS system next flows to the datacenter. Included in the datacenter may be power distribution units (PDUs). Also present in the data center maybe PDUs or separate transformers for reducing voltages to appropriate voltage for servers, computing equipment, security and control systems. For example, the voltage leaving the UPS can be as high as 480 volts, which must be converted to voltages of 120/208V for IT equipment. After the voltage is reduced, it may flow to one or more electrical breakers, which then distribute the electrical power within the datacenter.

The cooling system infrastructure must be able to remove heat generated by the servers and other computer equipment from the space within the datacenter building to the outside environment. The computer equipment in general requires limited conditions including temperature and other factors to operate efficiently and without incurring damage. The cooling system must include resiliency and redundancy to assure sufficient capacity to provide cooling under high demand situations due to heightened activity of the computer systems and due to extreme outdoor weather conditions. The system must also include adequate redundancy to protect against loss of cooling capacity, such as caused by component failure, equipment being taken out of service for maintenance or repair or upgrade, and equipment interconnection failure.

The cooling system should also be designed with features that optimize use under local environmental conditions and utilize resources and benefits available from the local or applicable municipalities.

The infrastructure cooling system preferably comprises one or more of modular chiller plants and one or more air handler unit (AEU) modules. The AEUs assist in heat removal and air circulation in the datacenter building. The heat removal and air circulation system may optionally be included in a cooling module or can be included in the interior of the building of the datacenter. In datacenters of the present invention chillers are not always used and under appropriate conditions, a desirable internal environment can be achieved with a fan system or an AEU.

The chiller plant module utilizes liquid to transport heat from the datacenter to the heat removal devices. The chiller plant modules include one or more of the following components: chiller, pump, cooling tower, water tank, valving, controls, water treatment and piping and manifolds to interconnect.

The chiller plant is sized to provide sufficient cooling to support the critical load in a redundant system, so that if a chiller plant becomes inoperable or defective, or is taken offline for servicing, repair or replacement, there exist chiller plant units that will operate to provide sufficient capacity to continue to operate the datacenter.

The AEU module utilizes air, rather than liquid to transport heat from the datacenter to the exterior heat rejection or removal devices. Each AEU module is sized to provide sufficient cooling for a portion of the critical load needed to operate the datacenter. Multiple modules of AEUs are used in the cooling system and, when operated in unison, provide a cooling capacity that is greater than that necessary to cool the datacenter. The capacity of the multiple AEU modules includes a redundancy capability and capacity. This means that an AEU module can operate independently of other AEU modules and that there exists ample capacity for cooling if one or more modules fail to operate or are taken offline for repair or replacement.

Each AEU module preferably contains one or more of the following components: fans, interior heat rejection coil, mechanical cooling device (compressor or evaporative cooling), exterior environment heat rejection device (coil), a damper arrangement to allow for incorporation of some outside air (when outside conditions are appropriate) or for providing heat rejection, optimization controls, an airflow path to interconnect modules and adjacent equipment with the datacenter computer equipment, self supporting structure to enable horizontal configuration for transport and vertical free standing configuration for operation.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A datacenter for providing continuous and secure access and storage for data, said datacenter comprising:
　a facility for housing computer-related and telecommunications-related equipment; and
　an infrastructure support system comprising electrical power infrastructure for providing electrical power for said facility, said infrastructure support system primarily situated outside said facility, said electrical power infrastructure comprising equipment and containers or modules containing said equipment, said equipment of said electrical power infrastructure comprising:
　a) a primary switchboard module containing a main or primary switchboard or switchgear and a plurality of automatic transfer switch (ATS) units;
　b) a secondary switchboard module containing a secondary switchboard or switchgear;
　c) two or more generators for generating electrical power including a primary generator and a reserve generator;
　d) two or more transformers including a primary transformer and a secondary transformer; and
　e) two or more uninterruptible power system (UPS) modules each containing one or more of UPS units and energy storage devices,
　wherein utility-sourced electrical power flows to said primary transformer and then to said main or primary switchboard of said primary switchboard module, from which electrical power flows to one or more of said plurality of ATS units in said primary switchboard module, said primary switchboard module subsequently transferring electrical power to one or more of said UPS units within one or more UPS modules, said UPS units distributing electrical power to the facility and other systems of the datacenter,
　wherein, if there is a loss of utility-sourced electrical power, one or more of said plurality of ATS units is capable of detecting the loss of utility-sourced electrical power and sensing alternative available electrical power sources in said electrical power infrastructure and is capable of carrying out steps to transfer the load to one or more of said available alternative sources of electrical power, wherein, if there is a loss of utility-sourced electrical power, said primary switchboard is capable of receiving electrical power from said primary generator in said electrical power infrastructure, wherein said secondary switchboard said secondary switchboard module is capable of (i) being activated by any of the ATS units in said primary switchboard module, (ii) receiving utility-sourced electrical power from said secondary transformer that bypasses said primary transformer and said primary switchboard, and (iii) receiving electrical power from said reserve generator which bypasses said primary switchboard and is capable of transferring electrical power to one or more ATS units, wherein said ATS units in said primary switchboard module are capable of transferring electrical power along alternative pathways to one or more UPS units, wherein said infrastructure support system contains redundancies in equipment, pathways and connections to possess no single point of potential failure in the availability of electrical power for operating at least some of the computer-related and telecommunications-related equipment in the facility, and wherein a capacity of the electrical power provided by said electrical power infrastructure based on utility-sourced electrical power exceeds the electrical load required by the facility and the capacity of the electrical power infrastructure based on non-utility-sourced electrical power exceeds a critical load required to operate the computer-related and telecommunications-related equipment in the facility.

2. The datacenter of claim 1, wherein the generator and transformer equipment are not contained within a module.

3. The datacenter of claim 1, wherein said energy storage devices comprise batteries.

4. The datacenter of claim 1, wherein a UPS module contains two or more UPS units.

5. The datacenter of claim 1, wherein at least one of said containers or modules containing electrical power infrastructure equipment has dimensions of not greater than a length of 40 feet, a width of 8 feet and a height of 8.5 feet.

6. The electrical power infrastructure of claim 1, wherein at least some infrastructure equipment therein is capable of (a) detecting an interruption in the flow of utility-sourced power, (b) shutting off the electrical pathway to the utility-sourced power when said interruption is detected, (c) triggering the operation of UPS and energy storage devices when said interruption in utility-sourced power is detected, (d) triggering the operation of generator equipment after said interruption in utility-sourced power is detected, (e) detecting the capability of generator equipment to supply electrical power to infrastructure components and opening the pathway for the flow of electrical power from said generator equipment to said infrastructure components, upon such detection shutting off the flow of electricity from said energy storage devices, and (f) detecting the resumption of the utility-sourced electrical power and when said resumption is detected, shutting off the electrical pathway to the generator-sourced power when said resumption is detected, triggering flow of electricity from said UPS and said energy storage devices, opening the pathway for flow of utility-sourced electrical power system to infrastructure components, and terminating the operation of said generator equipment.

7. The datacenter of claim 1, wherein the electrical power provided by said infrastructure support system based on utility-sourced electrical power exceeds the electrical load required by the facility and a cooling system for the facility.

8. The datacenter of claim 1, said infrastructure support system further comprising a cooling system for providing cooling for said facility.

9. The datacenter of claim 8, wherein said infrastructure support system includes a cooling system, and wherein said cooling system comprises two or more modular chiller plants and two or more air handler devices situated outside said facility and having a capacity exceeding the cooling requirements for the facility and including a redundant configuration and equipment which avoids any single potential site of failure for the cooling system.

10. The datacenter of claim 9, wherein one of said chiller plants and air handler devices of said cooling system are physically located above one or more of said modules or containers containing said electrical power infrastructure equipment.

11. An infrastructure support system for a datacenter, said infrastructure support system having redundant components, connections, pathways and controls such that said infrastructure support system is capable of supplying substantially uninterrupted power to operate at least computer and related equipment within the datacenter, at least said components being substantially situated outside a building that substantially contains the computer and related datacenter equipment, said infrastructure support system comprising:

a) control equipment that senses or controls or activates at least some of said components to supply usable electrical power to the datacenter equipment even when there is a failure in the flow of utility-sourced electrical power, said control equipment being capable of:

i) detecting an interruption in the flow of the utility-sourced power, ii) shutting off an electrical line to the utility-sourced electrical power when the utility-sourced power flow interruption is detected, iii) triggering operation of energy storage devices of a stored power supply system when the utility-sourced power flow interruption is detected, iv) triggering operation of at least one generator of a generator system when the utility-sourced power flow interruption is detected, v) detecting a capability of any of said generators of said generator system to supply usable electrical power to the datacenter equipment, vi) shutting off said energy storage devices when the power supply capability of said any of said generators of said generator system is detected, vii) detecting the resumption of the utility-sourced electrical power, and viii) terminating the operation of said any of said generators of said generator system and said energy storage devices when said resumption is detected; and b) a transformer system comprising one or more transformer units, each transformer unit operating when there is electricity flowing from the utility-sourced electrical power and being capable of converting the utility-sourced electrical power to a level of voltage suitable for use by at least some of the datacenter equipment, said transformer system having a redundancy capability and design permitting at least some of said transformer units to operate at least some of the datacenter equipment independently of other of said transformer units in the event of a malfunction in or inoperability of any of said other of said transformer units;

c) said stored power supply system, said stored power supply system comprising said energy storage devices, one or more of said energy storage devices being capable of (i) supplying stored electrical power independently of other sources of electrical power, (ii) being activated when the utility-sourced electrical power is interrupted, and (iii) being shut off when at least one of (a) the utility-sourced electrical power is activated and (b) said generator system is capable of supplying electrical power with a capacity that exceeds the load required to operate at least the datacenter equipment during a time period of required operation of said power supply system, at least some of said energy storage devices having a redundancy capability and design permitting supply of said stored electrical power therein to operate at least some of the datacenter equipment independently of other of said energy storage devices in the event of a malfunction in or inoperability of any of said other of said energy storage devices; and d) said generator system, said generator system comprising a plurality of said generators, each of said generators being capable of (i) operating independently of each other, (ii) being activated when the utility-sourced electrical power is interrupted, and (iii) being shut off when the utility-sourced electrical power resumes, said generator system having a capacity of supplying electrical power to satisfy at least the required load of the datacenter equipment, at least some of said generators having a redundancy capability and design to supply electrical power to operate at least some of the datacenter equipment independently of other of said generators of the generator system in the event of a malfunction in or inoperability of any of said other of said generators.

12. The infrastructure support system according to claim 11,
wherein said stored power supply system comprises:
a) one or more UPS modules, each including a UPS component and stored energy devices;
b) one or more primary switchboard modules, each including an ATS component and a circuit breaker component; and
c) one or more secondary switchboard modules,
wherein said generator system comprises
two or more generators, and
wherein said transformer system comprises
two or more transformers.

13. The infrastructure support system according to claim 11, wherein said control equipment, said transformer system, said stored power supply system, and said generator system are contained within one or more modules or containers, each of the modules or containers being substantially fabricated at a site distant from the datacenter.

14. The infrastructure support system according to claim 13, wherein each of the modules or containers is capable of being accessed for servicing or entirely removed from the datacenter without interrupting the operation of at least one of other of said components of the infrastructure support system or of the datacenter equipment.

15. The infrastructure support system according to claim 13, wherein each of the modules or containers has exterior connections for accessing at least some of said components contained therein and for connecting said components therein with other of said components in any of other modules or containers in the infrastructure support system.

16. The infrastructure support system of claim 11, wherein said system enables said energy storage devices to cooperate such that the stored power supply system is uninterruptible.

17. A datacenter for providing continuous and secure access and storage for data, said datacenter comprising:
a facility for housing computer-related and telecommunications-related equipment; and
an infrastructure support system for comprising electrical power infrastructure for providing electrical power to said facility and a cooling system for cooling said facility, said infrastructure support system primarily situated outside said facility, said electrical power infrastructure comprising equipment and containers or modules containing said equipment, said equipment of said electrical power infrastructure comprising:
a) a primary switchboard module containing a main or primary switchboard or switchgear and a plurality of automatic transfer switch (ATS) units;
b) a secondary switchboard module containing a secondary switchboard or switchgear;
c) two or more generators for generating electrical power including a primary generator and a reserve generator;
d) two or more transformers including a primary transformer and a secondary transformer; and
e) two or more uninterruptible power system (UPS) modules each containing one or more of UPS units and energy storage devices,
wherein said infrastructure support system contains redundancies in equipment, pathways and connections to possess no single point of potential failure in the availability of electrical power for operating at least some of the computer-related and telecommunications-related equipment in the facility, and
wherein the capacity of the electrical power provided by said infrastructure support system based on utility-sourced electrical power exceeds the electrical load required by the facility and the cooling system for the facility, and the capacity of the electrical power infrastructure based on non-utility-sourced electrical power exceeds a critical load required to operate the computer-related and telecommunications-related equipment in the facility.

18. An infrastructure support system comprising electrical power infrastructure for providing electrical power for at least computer and related equipment within a datacenter facility, said infrastructure support system primarily situated outside said datacenter facility, said electrical power infrastructure comprising equipment and containers or modules containing said equipment, said equipment of said electrical power infrastructure comprising:
a) a primary switchboard module containing a main or primary switchboard or switchgear and a plurality of automatic transfer switch (ATS) units;
b) a secondary switchboard module containing a secondary switchboard or switchgear;
c) two or more generators for generating electrical power including a primary generator and a reserve generator;
d) two or more transformers including a primary transformer and a secondary transformer; and
e) two or more uninterruptible power system (UPS) modules each containing one or more of UPS units and energy storage devices,
wherein utility-sourced electrical power flows to said primary transformer and then to said main or primary switchboard of said primary switchboard module, from which electrical power flows to one or more of said plurality of ATS units in said primary switchboard module, said primary switchboard module subsequently transferring electrical power to one or more of said UPS units within one or more UPS modules, said UPS units distributing electrical power to at least the datacenter facility, wherein, if there is a loss of utility-sourced electrical power, one or more of said plurality of ATS units is capable of detecting the loss of utility-sourced electrical power and sensing alternative available electrical power sources in said electrical power infrastructure and is capable of carrying out steps to transfer the load to one or more of said available alternative sources of electrical power, wherein, if there is a loss of utility-sourced electrical power, said primary switchboard is capable of receiving electrical power from said primary generator in said electrical power infrastructure, wherein said secondary switchboard in said secondary switchboard module is capable of (i) being activated by any of the ATS units in said primary switchboard module, (ii) receiving utility-sourced electrical power from said secondary transformer that bypasses said primary transformer and said primary switchboard, and (iii) receiving electrical power from said reserve generator which bypasses said primary switchboard and is capable of transferring electrical power to one or more ATS units, wherein said ATS units in said primary switchboard module are capable of transferring electrical power along alternative pathways to one or more UPS units, wherein said infrastructure support system contains redundancies in equipment, pathways and connections to possess no single point of potential failure in the availability of electrical power for operating the computer and related equipment in the datacenter facility, and wherein a capacity of the electrical power provided by said electrical power infrastructure based on utility-sourced electrical power exceeds the electrical load required by the datacenter facility and the capacity of the electrical power infrastructure based on non-utility-sourced electrical power exceeds a critical load required to operate the computer and related equipment in the datacenter facility.

* * * * *